US005891779A

United States Patent [19]
Chung et al.

[11] Patent Number: 5,891,779
[45] Date of Patent: Apr. 6, 1999

[54] METHOD OF FABRICATING TETRA-STATE MASK READ ONLY MEMORY

[75] Inventors: Cheng-Hui Chung, Hsinchu Hsien; Yi-Chung Sheng, Taichung, both of Taiwan

[73] Assignee: United Microelectronics Corp., Taiwan

[21] Appl. No.: 9,300

[22] Filed: Jan. 20, 1998

[30] Foreign Application Priority Data

Nov. 28, 1997 [TW] Taiwan ................................. 86117920

[51] Int. Cl.$^6$ .............................................. H01L 21/8236
[52] U.S. Cl. ............................................ 438/276; 438/278
[58] Field of Search .................................. 438/130, 275, 438/276, 277, 278, 289, 290, 291, 587, 588

[56] References Cited

U.S. PATENT DOCUMENTS

| | | | |
|---|---|---|---|
| 5,358,887 | 10/1994 | Hong ....................................... | 438/278 |
| 5,545,580 | 8/1996 | Sheng et al. ............................. | 438/276 |
| 5,585,297 | 12/1996 | Sheng et al. ............................. | 438/278 |
| 5,661,326 | 8/1997 | Hong ....................................... | 438/276 |
| 5,693,551 | 12/1997 | Su et al. .................................. | 438/278 |
| 5,721,169 | 2/1998 | Lee ......................................... | 438/278 |

*Primary Examiner*—Charles Bowers
*Assistant Examiner*—Jack Chen
*Attorney, Agent, or Firm*—Rabin & Champagne, P.C.

[57] ABSTRACT

A method of fabricating a tetra-state mask read only memory. A memory device is fabricated. Using a first photo-resist to dope the channel regions, a first coding step is performed to obtain a transistor having two different threshold voltage. Covering a gate oxide layer, and etching the first photo-resist layer to form a via, a buried bit line is formed. A poly-silicon layer is formed on the gate oxide layer. Doping the second poly-silicon layer by implanting ions to the source/drain regions, and using a second photo-resist layer, a second coding step is performed. An inverse transistor with two different threshold voltage is formed.

15 Claims, 6 Drawing Sheets

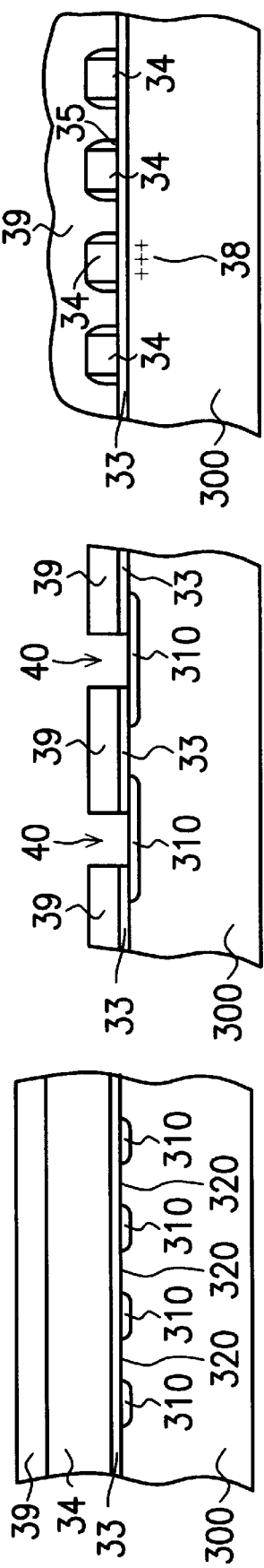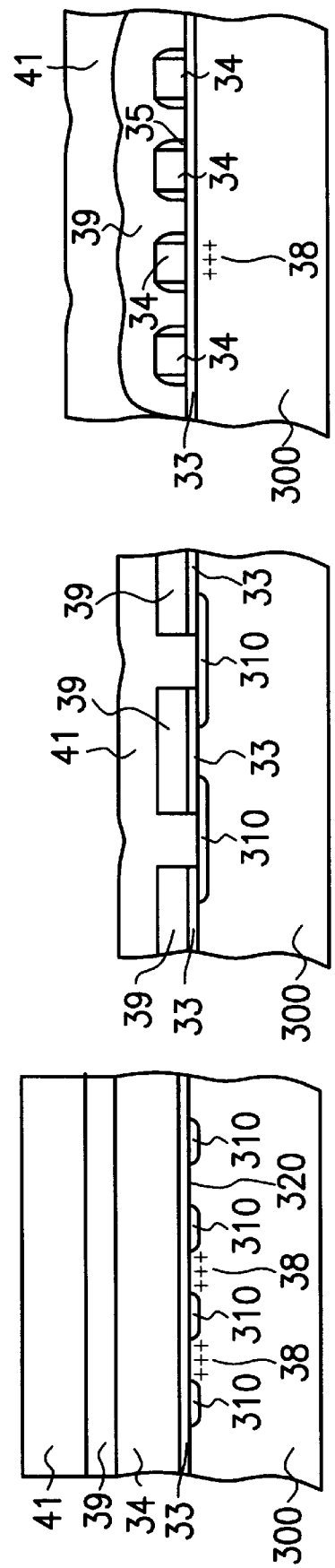

METHOD OF FABRICATING TETRA-STATE MASK READ ONLY MEMORY

CROSS-REFERENCE TO RELATED APPLICATION

This application claims the priority benefit of Taiwan application Ser. No. 86117920, filed Nov., 28, 1997, the full disclosure of which is incorporated herein by reference.

BACKGROUND OF THE INVENTION

1. Field of the Invention

The invention relates to a method of fabricating an integrated circuit, and more particularly to a method of fabricating an integrated circuit with high density, such as a non-volatile multi-mask read only memory (ROM).

2. Field of the Related Art

Being restricted by the technical limit of designing a memory, to reduce the dimension of a memory device, the technique of process needs to be improved. The conventional ROM is assembled by an array of field effect transistor metal oxide semiconductors (FET MOS). Each memory cell comprises a single field effect device disposed at the intersection of a parallel conductive line buried in the substrate and a vertical conductive line formed on the substrate. The formation of each field effect transistor provides the choice between either of two predetermined values depending on the characteristics of transistor, such as the threshold voltage. By doping the channel region of a transistor, a higher threshold voltage is obtained. The transistor is not turned on by applying the voltage Vcc to the gate. On the contrary, with the undoped channel region, the transistor is turned on by the voltage Vcc applied to the gate. Binary data are stored into the memory cell by selectively doping the channel regions. That is, a logic "0" is stored in a transistor with a doped channel region, and a logic "1" lis stored in a transistor with an undoped channel region.

FIG. 1 is a top view of a region (including four memory cells) of a conventional mask ROM. Referring to FIG. 1, a mask ROM is formed on a substrate 10 having a P-type surface. The mask ROM comprises an array of parallel buried bit lines 12, 14 and 16 which are N-type bit lines formed by selectively doping the substrate 10, and an array of parallel word lines 18 and 20 expanding on the substrate 10. The array of word lines 18 and 20 is perpendicular to the array of bit lines 12, 14, and 16. In addition, a silicon oxide layer is formed between two word lines 18 and 20 for the purpose of isolation. Normally, in a mask ROM, a structure of sharing a word line is adapted. The bit lines 12, 14, and 16 are the source/drain regions of field effect transistors, whereas, the regions 22, 24, 26, and 28 connecting with the bit lines 12, 14, and 16 under the word lines 18 and 20 are the channel regions of field effects transistors.

FIG. 2 is a cross sectional view of a conventional ROM shown as 2-2' in FIG. 1. Referring to FIG. 2, to form a buried bit line, a proper mask (not shown on the figure) is used to cover the substrate 10. An N-type dopant is implanted into the substrate 10 to form bit lines 12, 14, and 16. The doped substrate 10 is then put into an environment of oxygen to activate the dopant within the bit lines 12, 14, and 16, and to form an oxide layer. The oxide layer comprises a thinner gate oxide layer 30 on the channel region 22 and 24, and a thicker oxide layer 32 covering the bit lines 12, 14, and 16. The thicker oxide layer 32 is formed because of the much larger oxidation diffusion rate of the heavily doped N-type dopant in the bit lines 12, 14 and 16 than the lightly doped P-type ions in the channel regions 22 and 24. After the formation of the thicker oxide layer 32, a doped poly-silicon layer is formed on the gate oxide layer 30 and the thicker oxide layer 32. The poly-silicon layer is then defined to form a gate electrode 18 of the field effect transistor. The gate electrode is used as a word line in the ROM.

As the size of the memory becomes smaller and smaller, the width of the buried bit lines becomes narrower and narrower. The space of the bit line also shrinks further. The smaller the bit line is, the larger the resistance is obtained. Thus, the speed to access the data in a ROM is slower. The dimension of a transistor is limited in the consideration of access speed. On the other hand, the conventional multi-state method of fabricating a ROM is very complex. Moreover, it is difficult to control the dosage for the formation of different threshold voltage, and therefore, it is difficult to obtain a larger data storage.

SUMMARY OF THE INVENTION

It is therefore an object of the invention to provide a method of fabricating tetra-state mask ROM. Using a fabricating technique of a thin film transistor to fabricate double layered memory transistors sharing the same gate oxide layer. A ROM having four threshold voltage is formed. By the transistors of different characteristics, the multi-bit data are stored in a single memory unit. The storing density is increased within limited dimension and space.

To achieve these objects and advantages, and in accordance with the purpose of the invention, as embodied and broadly described herein, the invention is directed towards a method of fabricating a tetra-state mask read only memory. A semiconductor substrate having a gate oxide layer, a first poly-silicon layer, a plurality of source/drain regions, and a plurality of channel regions is provided. A first coding step is performed to a part of the channel regions, by using a first photo-resist layer as a mask and doping the part of the channel regions. A thin film transistor oxide layer is formed over the substrate. A plurality of via holes are patterned to expose the source/drain regions, by removing a part of the thin film transistor oxide layer and the gate oxide layer. A second poly-silicon layer is formed on the thin film transistor oxide layer. Using a mask to dope a part of the second poly-silicon layer with dopant, a plurality of doped regions are formed. Using a second photo-resist layer as a mask, a part of the second poly-silicon layer corresponding to the channel regions is doped with dopant, and a second coding step is performed.

It is to be understood that both the foregoing general description and the following detailed description are exemplary and explanatory only and are not restrictive of the invention, as claimed.

BRIEF DESCRIPTION OF THE DRAWINGS

FIG. 4a to FIG. 4f show the cross sectional views of the process of fabricating a tetra-state mask ROM shown as the line A-A' in FIG. 3;

FIG. 5a to FIG. 5f show the cross sectional views of the process of fabricating a tetra-state mask ROM shown as the line B-B' in FIG. 3;

FIG. 6a to FIG. 6f show the cross sectional views of the process of fabricating a tetra-state mask ROM shown as the line C-C' in FIG. 3;

DESCRIPTION OF THE PREFERRED EMBODIMENTS

Figure 1:
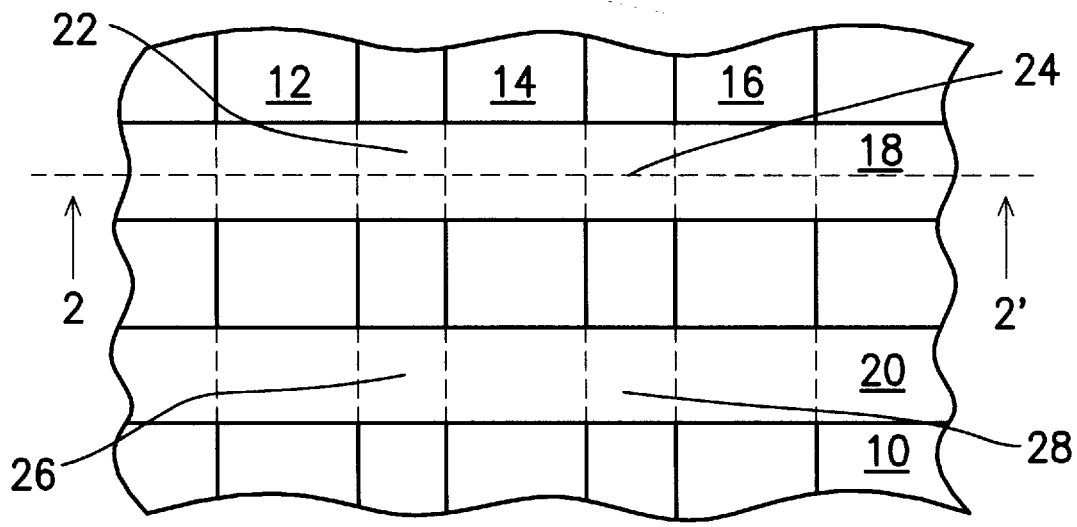
FIG. 1 is a top view of a region of a conventional mask ROM.
Figure 2:
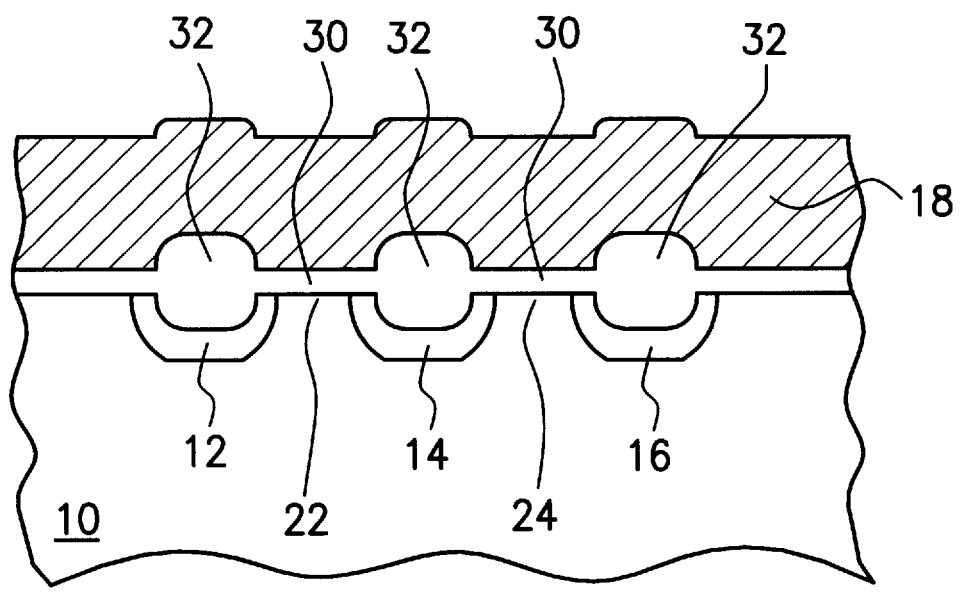
FIG. 2 is a cross sectional view of the conventional ROM shown as the dash line 2-2' in FIG. 1.
Figure 3:
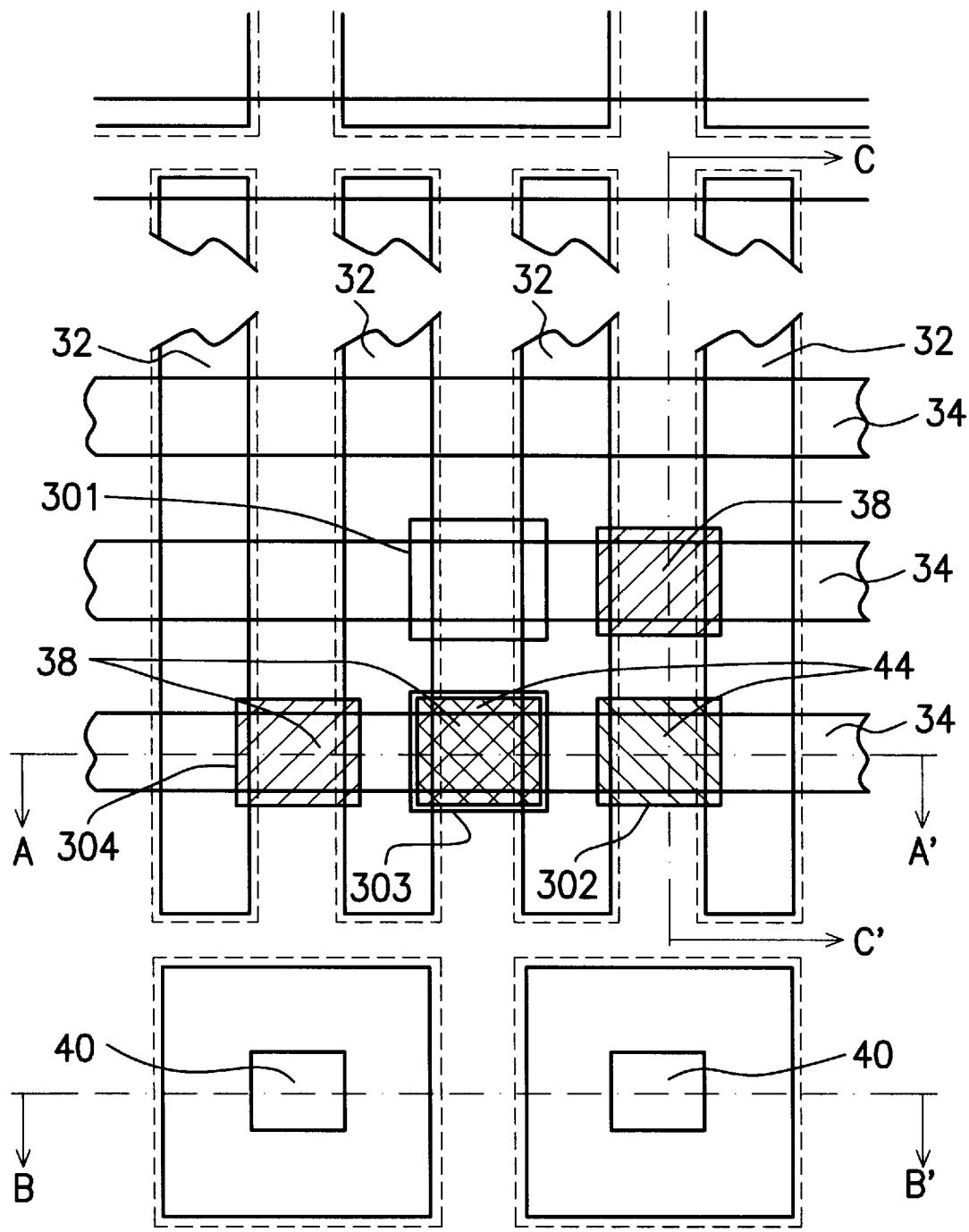
FIG. 3 is a top view of a region of a tetra-state mask ROM in a preferred embodiment according to the invention.
Figures 6A, 6B:
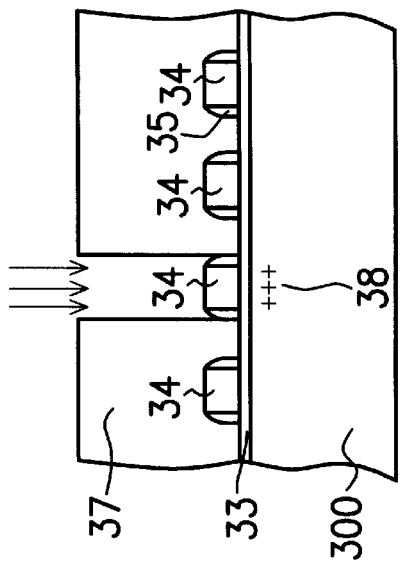
Figures 5A, 5B:
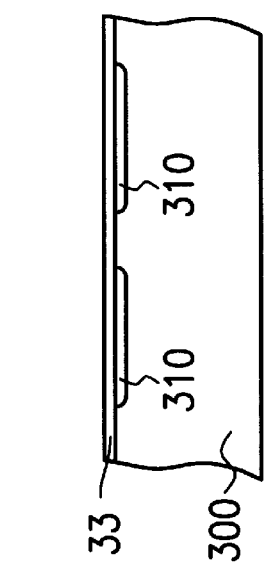

Referring to FIG. 3, FIG. 4a, FIG. 5a, and FIG. 6a, a semiconductor substrate 300 is provided. The substrate 300 comprises a source/drain region 310 to form a buried bit line, a channel region 320 to separate the source/drain region, and a gate 36 assembled by a gate oxide layer 33, a first poly-silicon layer 34, and a spacer 35. In FIG. 3, the channel region 320 further comprises a first region 301, a second region 302, a third region 303, and a fourth region 304.

Referring FIG. 3, FIG. 4b, FIG. 5b, and FIG. 6b, using a photo-mask fabricated according to certain process, a first photo-resist layer 37 is formed to cover the substrate 300. Coding windows, the second region 302 and the third region 303 of the channel region 320, are exposed to perform a first coding step. The second region 302 and the third region 303 of the channel region 320 are doped with dopant, for example, by ios implantation. Thus, the threshold voltage of the doped channel region 38 is different from the undoped channel region 320.

Referring to FIG. 4c, FIG. 5c, and FIG. 6c, the first photo-resist layer 37 is removed. A thin film transistor oxide layer 39 is formed and patterned over the substrate 300, after etching part of the thin film transistor layer 39 and the first poly-silicon layer 34, a via hole 40 which exposes the buried bit line 310 is formed.

Figures 4A, 4B:
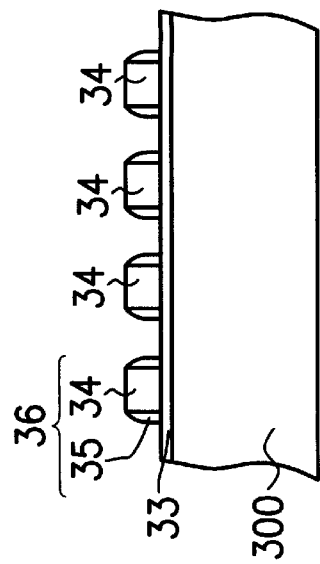
Figure 4E:
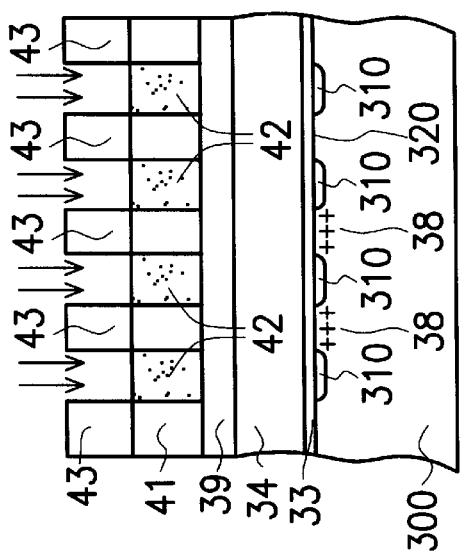
Figure 5E:
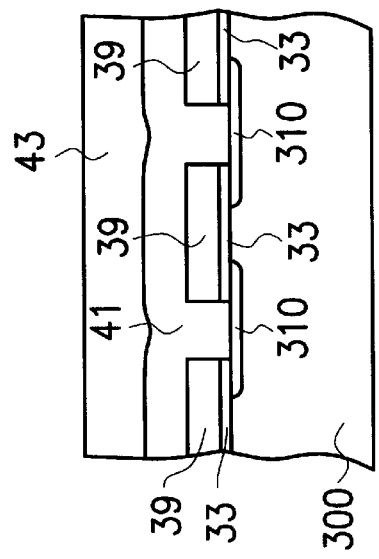
Figure 6E:
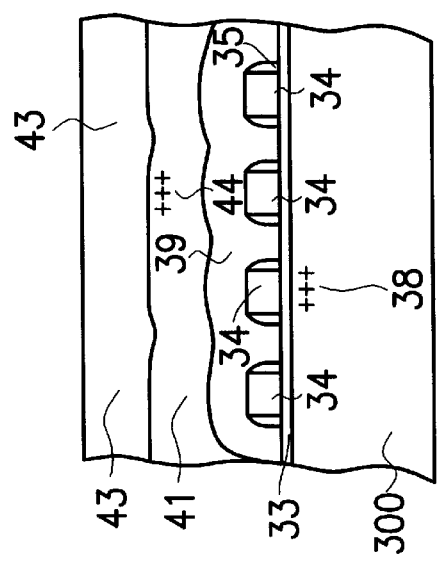

Referring to FIG. 4d, FIG. 5d, and FIG. 6d, a P-type doped second poly-silicon layer 41 is formed over the substrate 300. Referring to FIG. 4e, FIG. 5e, and FIG. 6e, using a photo-mask 43, the second poly-silicon layer 41 is doped with an N-type dopnat. The source/drain region 310 corresponding to the second poly-silicon layer 41 is then transformed to an N-type doped region 42. By assembling the thin film transistor oxide layer 39, the second poly-silicon layer 41, and the N-type doped region 42, an inverse thin film transistor structure is formed. The thin film transistor oxide layer 39 is functioned as a gate oxide layer, the second poly-silicon layer 41 is functioned as a substrate, and the N-type doped region 42 is functioned as a source/drain region.

Figure 4F:
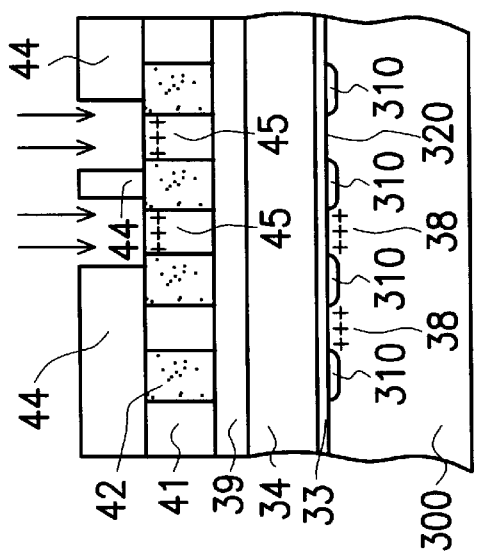
Figure 5F:
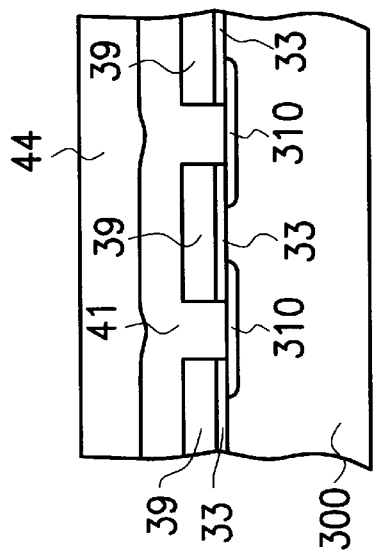
Figure 6F:
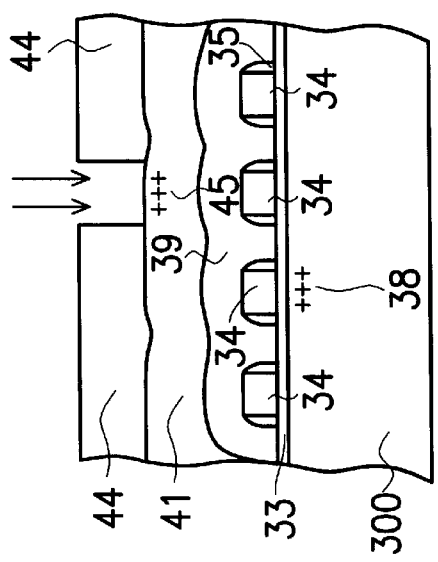

Referring to FIG. 4f, FIG. 5f, and FIG. 6f, a second photo-resist layer is formed on the thin film transistor, whereas second coding windows are exposed. The second coding windows are the third region 303 and the fourth region 304 of the channel region 320. The second poly-silicon layer of the inverse thin film transistor corresponding to the third region 303 and the fourth region 304 is doped with dopant, for example, by ion implantation. Therefore, the threshold voltage of the undoped poly-silicon layer 41 is different from the doped poly-silicon layer 45. The second photo-resist layer 44 is removed. The back end process is then performed to complete the fabrication of metal wiring and contact, and thus, a tetra-state mask ROM is formed.

Figure 7:
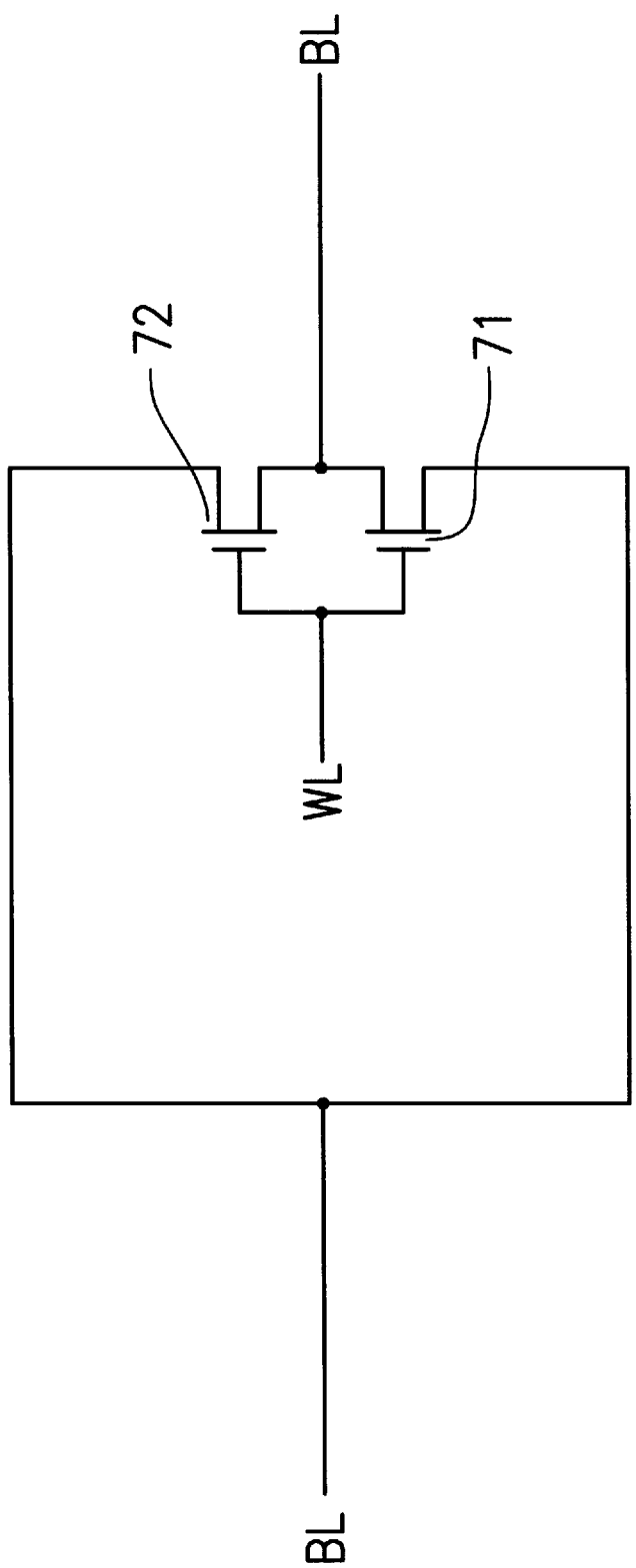
FIG. 7 is a simple schematic diagram of a tetra-state mask ROM in a preferred embodiment according to the invention.

In the invention, a tetra-state mask ROM of a double layered structure fabricated by two coding steps has four different threshold voltages. Referring to FIG. 3, on the substrate 300, the first region 301 of the channel region 320 is not doped through the first and the second coding steps. The second region 302 is doped in the first coding step only. The third region 303 is doped in both the first and the second coding steps, and the fourth region 304 is doped in the second coding step only. Referring FIG. 7, for the transistor memory cell 71, the threshold current of the first buried bit line is I1, and the threshold current for the transistor memory cell 72 of the second buried bit line is I2. When the result of the first coding step is set "on", and the result of the second coding step is set "off", a current of I1 is obtained. If the results of the first and the second coding steps are both "on", a current of I1+I2 is obtained. If the result of the first coding step is "off" and the result of the second coding step is "on", a current of I2 is obtained. Whereas, if the results of the first and the second coding steps are set "off", a current of 0 is obtained. Four different currents are obtained with four different threshold voltages. Therefore, by two coding steps, a tetra-state mask ROM is fabricated.

Therefore, one of the characteristics of the invention, is the formation of a double layered transistor structure. The upper layer is an inverse thin film transistor, sharing a poly-silicon layer with the transistor of the lower layer. The dimension of the structure is reduced.

Another characteristic of the invention is that by using two coding steps, two transistors with two different threshold voltage respectively, are assembled to form a tetra-state mask ROM.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a tetra-state mask read only memory, comprising:

provididing a semiconductor substrate having a gate oxide layer, a first poly-silicon layer, a plurality of source/drain regions, and a plurality of channel regions;

performing a first coding step to a part of the channel regions, by using a first photo-resist layer as a mask to dope the part of the channel regions;

forming a thin film transistor oxide layer over the substrate;

patterning a plurality of via holes to expose the source/drain regions, by removing a part of the thin film transistor oxide layer;

forming a second poly-silicon layer on the thin film transistor oxide layer;

using a mask to dope a part of the second poly-silicon layer with dopant to form a plurality of doped regions; and using a second photo-resist layer as a mask, doping a part of the second poly-silicon layer corresponding to the channel regions with dopant, and performing a second coding step.

2. The method according to claim 1, wherein the channel regions comprise a first region, a second region, a third region, and a fourth region.

3. The method according to claim 2, wherein using a first photo-resist layer as a mask and doping the part of the channel regions further comprise:

forming the first photo-resist layer over the substrate;

patterning and removing a part of the first photo-resist layer to expose the second region and the third region of the channel regions;

doping the second region and the third region of the channel regions; and removing the first photo-resist layer.

4. The method according to claim 1, wherein the second region and the third region of the channel regions are doped by ion implantation.

5. The method according to claim 1, wherein the second poly-silicon layer is a P-type doped poly-silicon layer.

6. The method according to claim 1, wherein the doped regions are corresponding to the source/drain regions.

7. The method according to claim 1, wherein the doped regions are doped with N-type dopant.

8. The method according to claim 6, wherein the N-type dopant is doped by ion implantation.

9. The method according to claim 2, wherein using a second photo-resist layer as a mask and doping the second poly-silicon layer corresponding to doped channel regions further comprise:

forming the second photo-resist layer over the substrate;

patterning and removing a part of the second photo-resist layer to expose the second poly-silicon layer corresponding to the third region and the fourth region of the channel regions;

doping the poly-silicon layer corresponding to the third region and the fourth region of the channel regions; and removing the second photo-resist layer.

10. The method according to claim 9, wherein the second coding step is a doping step by ion implantation.

11. A method of fabricating a tetra-state mask read only memory, comprising:

providing a semiconductor substrate having a gate oxide layer, a first poly-silicon layer, a plurality of source/drain regions, and a plurality of channel regions which comprise a first region, a second region, a third region, and a fourth region;

forming a first photo-resist layer over the substrate;

patterning the first photo-resist layer to expose the second region and the third region;

performing a first coding step, doping the second and the third regions;

forming a thin film transistor oxide layer over the substrate;

patterning the thin film transistor oxide layer to form a plurality of via holes to expose the source/drain regions;

forming a second poly-silicon layer on the thin film transistor oxide layer;

using a mask to dope a part of the second poly-silicon layer with dopant to form a plurality of doped regions;

forming a second photo-resist layer on the second poly-silicon layer;

patterning the second photo-resist layer to expose the second poly-silicon layer corresponding to the source/drain regions;

performing a second coding step, doping the second poly-silicon layer corresponding to the third region and the fourth region; and removing the second photo-resist layer.

12. The method according to claim 11, wherein the first coding step is performed by ion implantation.

13. The method according to claim 11, wherein the second coding step is performed by ion implantation.

14. The method according to claim 11, wherein the second poly-silicon layer is a P-type doped poly-silicon layer.

15. The method according to claim 11, wherein the doped regions are formed by doping N-type dopant into the second poly-silicon layer.

\* \* \* \* \*